United States Patent [19]

Dowgiallo, Jr.

[11] 3,984,762
[45] Oct. 5, 1976

[54] METHOD FOR DETERMINING BATTERY STATE OF CHARGE BY MEASURING A.C. ELECTRICAL PHASE ANGLE CHANGE

[75] Inventor: Edward J. Dowgiallo, Jr., Oxon Hill, Md.

[73] Assignee: The United States of America as represented by the Secretary of the Army, Washington, D.C.

[22] Filed: Mar. 7, 1975

[21] Appl. No.: 556,526

[52] U.S. Cl. .......................... 324/29.5; 324/60 CD; 320/48; 320/51
[51] Int. Cl.² ........................................ G01N 27/42
[58] Field of Search ............... 324/29.5, 60 CD, 82; 320/14, 48, 51

[56] References Cited
UNITED STATES PATENTS
2,177,569  10/1939  Jorgensen...................... 324/60 CD OTHER PUBLICATIONS
Willihnganz, "Battery Impedance" Electrical Engineering, vol. 78, No. 9, Sept. 1959, pp. 922–925.

Primary Examiner—R. V. Rolinec
Assistant Examiner—Michael J. Tokar
Attorney, Agent, or Firm—Nathan Edelberg

[57] ABSTRACT

Several embodiments for determining the state of charge of a cell or battery are disclosed. In accordance with one method of this invention, an A.C. voltage is applied to a cell or battery through a shunt. The phase angle between the A.C. voltage across the battery terminals and the A.C. current through the battery (measured as a shunt voltage) is continuously monitored. This phase angle is converted to an analog voltage which represents the A.C. component that is phase shifted by the impedance of the battery. The impedance and thus the phase angle changes with the state of charge of the battery. The analog voltage can be coupled to a meter that provides a phase angle reading or a state of charge reading. Further, the analog voltage can be used to control charge and discharge circuitry. In accordance with a second method, the state of charge of a battery is determined by taking phase angle readings based on input and output A.C. voltages.

2 Claims, 6 Drawing Figures

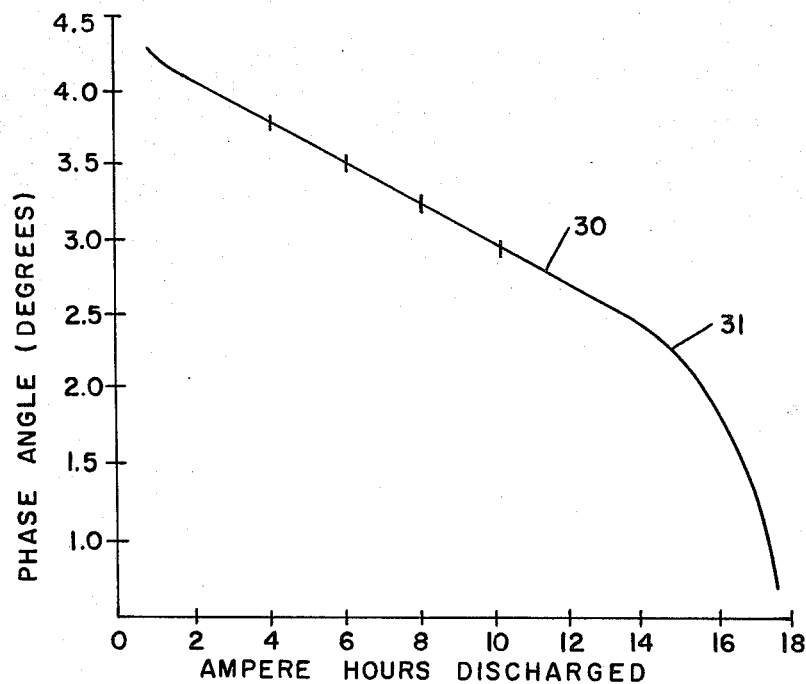
FIG. 4.
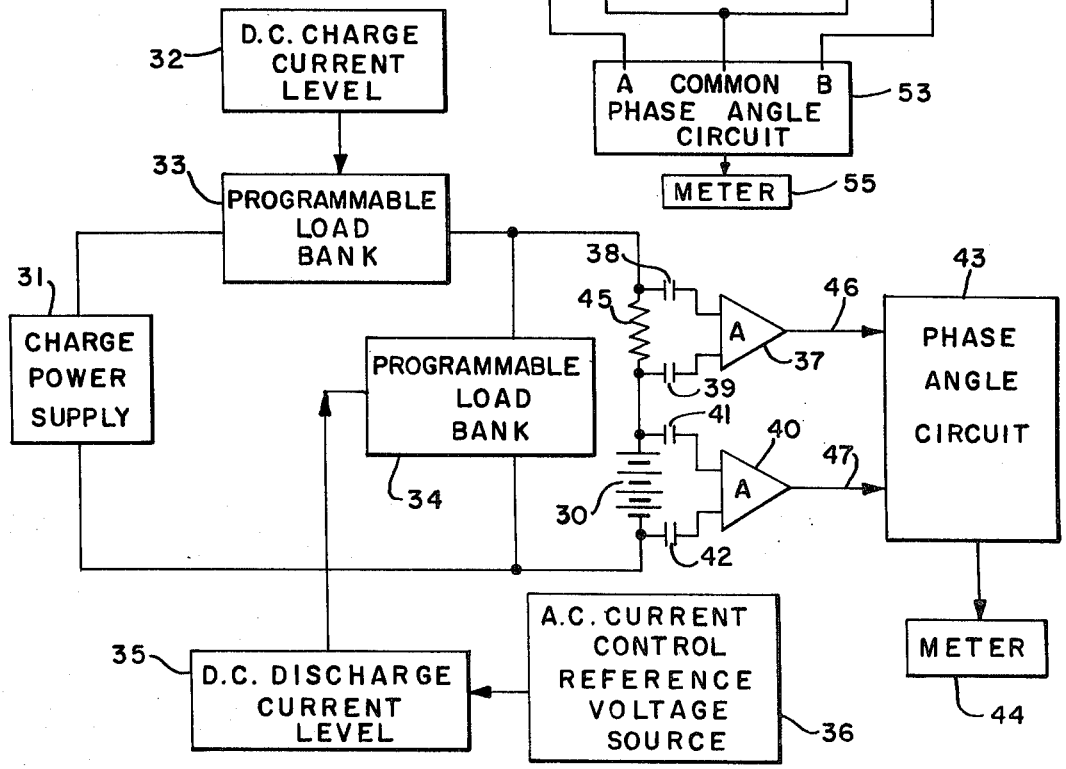
FIG. 5.
FIG. 6.

3,984,762

METHOD FOR DETERMINING BATTERY STATE OF CHARGE BY MEASURING A.C. ELECTRICAL PHASE ANGLE CHANGE

The invention described herein may be manufactured, used, and licensed by or for the Government for Governmental purposes without the payment to me of any royalties thereon.

BACKGROUND OF THE INVENTION

This invention relates to battery state of charge monitoring systems, and more particularly, to a method and the apparatus for determining battery state of charge by measuring the phase angle change of an A.C. voltage applied to the battery.

There are many applications where it is essential to know the state of charge of batteries. For example, in an electrical vehicle, measuring the state of charge of the battery or batteries utilized in the vehicle permits one to determine the useful life remaining before the battery or batteries need to be recharged and permits one to charge the battery or batteries without overcharging. There are, of course, many other applications where it is essential to know the state of charge of the batteries being utilized.

There are, of course, several different methods known in the art for determining the state of charge of a cell or battery of cells. One such prior art method utilizes current integrators. When utilizing these current integrators one must correct the measurement obtained since several factors affect the accuracy of this measurement. Some factors that affect the measurement of state of charge current integrators are: temperature, previous history, efficiency and cycle life.

Another method commonly used is the measurement of the specific gravity of the battery. Specific gravity measurements are not accurate, require long stand times for equilibrium and do not provide proportional voltage read outs. Further, for some batteries, such as nickel cadmium batteries, specific gravity measurements do not provide a state of charge indication since the specific gravity of a nickel cadmium battery does not change. In addition, specific gravity measurements of sealed batteries can obviously not be obtained.

Still another prior art method used to measure battery state of charge involves measuring state of charge with battery response to current or voltage pulses. These pulse systems are go-no-go systems that provide a rough means of relating state of charge and are used primarily to determine if a battery is still useful.

Another known method of measuring state of charge involves impedance measurements utilizing bridge circuits that are manually adjusted. The measurements obtained are compared with previously generated standard reference curves. These bridge systems are difficult to automate.

This invention provides a means of continuously following a cell or battery state of charge by monitoring the phase change of an A.C. voltage applied to the cell or battery being monitored. Electronic circuitry is utilized; therefore, the system operates automatically and the measurements obtained need not be corrected for various factors that affect the accuracy of the measurements obtained by some of the prior art systems.

SUMMARY OF THE INVENTION

In accordance with this invention, the state of charge of a cell or battery is determined by applying an alternating voltage to the cell or battery through a shunt. The phase angle between the A.C. voltage across the cell or battery terminals and the A.C. current through the cell or battery (measured as a shunt voltage) is continuously monitored. This phase angle measurement is converted to a proportional analog voltage. This analog voltage represents the A.C. component that is phase shifted by the impedance of a cell or battery. The impedance of a cell or battery changes with the state of charge. The analog voltage is coupled to appropriate instrumentation for obtaining a phase angle read out.

The invention is particularly well suited for measuring the state of charge of nickel cadmium cells or batteries. However, the invention can be used to measure the state of charge of other cells or batteries including acid cells and batteries.

In addition to providing a state of charge read out, the analog voltage obtained can be used as a control signal. For example, the analog voltage can be used to switch a battery from a load to a charger and when charged, back to the load.

BRIEF DESCRIPTION OF THE DRAWING

The exact nature and structural details of the invention can be obtained from the following detailed description when read in conjunction with the annexed drawing in which:

FIG. 4 is an Ampere-hours discharged vs. phase angle curve useful in describing the operation of FIG. 3.

FIG. 5 shows in block diagram form an embodiment of the invention utilized in a charging and discharging circuit; and FIG. 6 shows a basic embodiment of the invention for determining state of charge of a battery in accordance with a second method of this invention.

DESCRIPTION OF THE INVENTION

The method and apparatus of this invention are particularly useful in measuring the state of charge of nickel cadmium batteries in such equipment as transmitters, receivers, telemetering systems, tape recorders, movie cameras, aircraft, electric vehicles, small calculators and computers, amplifiers, timers, solenoids and the like. Test results mainly with nickel cadmium batteries have demonstrated a well defined relationship between state of charge and phase angle charges. This invention relies on this relationship.

Figure 1:
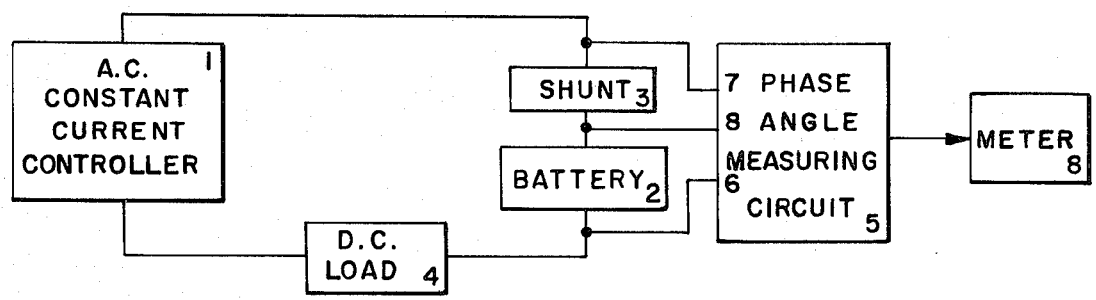
FIG. 1 shows in block diagram form a basic embodiment of the invention.

Referring to FIG. 1, this figure shows a basic embodiment of the invention. As shown in FIG. 1, the invention comprises an A.C. constant current controller 1 coupled to battery 2 through a shunt 3. The battery is shown as being coupled to the load 4. The A.C. voltage appearing across the terminals due to A.C. controller 1 is applied to the input 6 of the phase angle measuring circuit 5. The phase of this voltage is to be compared with the phase of the A.C. current flow through battery 2. This A.C. current measurement is obtained as an A.C. voltage by means of the shunt 3 and is applied to input 7 of phase angle measuring circuit 5. Phase angle measuring circuit 5 is any suitable circuit that provides an output indicative of the phase angle difference between the voltage applied to input 6 and the voltage applied to input 7. Such circuits are well known in the art and circuits capable of measuring phase differences to one tenth of a degree are available on the market. The output of phase angle measuring circuit 5 is applied to the meter 8 which may be a meter that provides phase angle readings or a meter that provides a direct read out in terms of state of charge.

The circuitry of FIG. 1 provides a measure of state of charge of battery 2 due to the fact that the impedance of the battery changes with a change in the state of charge of the battery. At low frequencies this change in impedance is mostly capacitive and at higher frequencies mostly inductive. Due to this impedance change there will of course be a phase shift.

Figure 2:
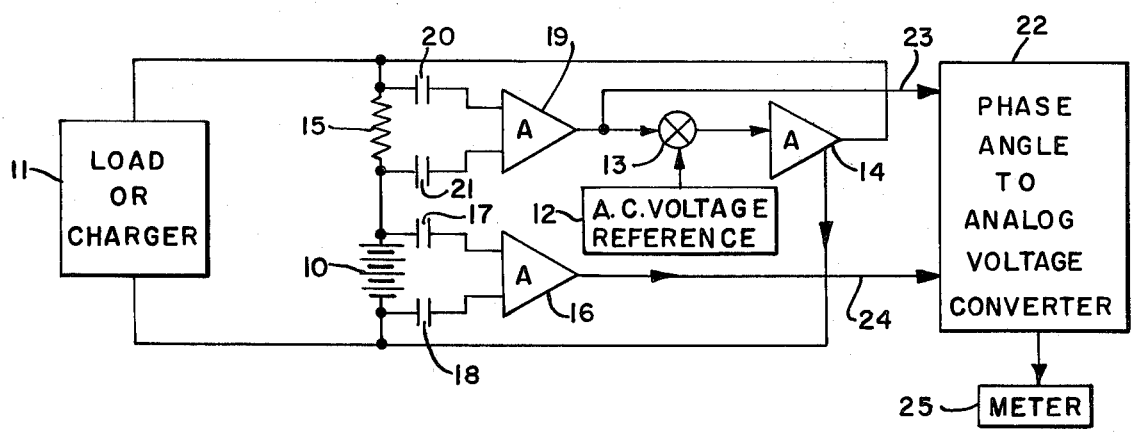
FIG. 2 shows in block diagram form a second embodiment of the invention.

FIG. 2 shows a second embodiment of the invention. The FIG. 2 embodiment is an extension of the basic embodiment of FIG. 1. Referring to FIG. 2, a battery 10 is coupled to the load or charger 11. A constant A.C. current derived from the A.C. voltage reference 12 and the current regulator consisting of the comparator 13 and the error amplifier 14 is applied to battery 10 through the shunt resistor 15. The A.C. voltage applied across the terminals of battery 10 is also applied to the input of the amplifier 16. This A.C. voltage is coupled to the input of amplifier 16 through the coupling capacitors 17 and 18. Capacitors 17 and 18 are provided to block the D.C. from the input of amplifier 16. The A.C. current flowing through battery 10 is measured as an A.C. voltage by means of shunt resistor 15. This A.C. voltage representing the current flow is applied to the input of the amplifier 19 through the coupling capacitors 20 and 21. Again coupling capacitors 20 and 21 provide D.C. blocking to the input of amplifier 19.

The output of amplifier 19 is coupled to one input of comparator 13. A.C. voltage reference 12 is coupled to the other input of comparator 13. The output of comparator 13 is coupled to the input of error amplifier 14. The output of error amplifier 14 is connected across the battery 10 — shunt 15 circuit. As mentioned previously, comparator 13 and amplifier 14 serve as a current regulator. Amplifier 14 is a variable impedance device that responds to the output from comparator 13. Such current regulating circuits are well known in the art.

The output of amplifier 19 is also applied to the input 23 of the phase angle to analog voltage converter 22 and the output of amplifier 16 is applied to the input 24 of phase angle to analog voltage converter 22. Phase angle to analog voltage converter 22 is a well known device that provides an analog voltage output that is indicative of the phase angle difference between the A.C. voltage applied to inputs 23 and 24. The output of phase angle to analog converter 22 is applied to a meter 25 which may be a meter that provides a phase angle read out or one that provides a direct state of charge reading. For some applications meter 25 may be considered as being a fuel gage. For example, in an electric vehicle, the fuel source is battery 10 and meter 25 provides a reading of the state of charge of battery 10.

Figure 3:
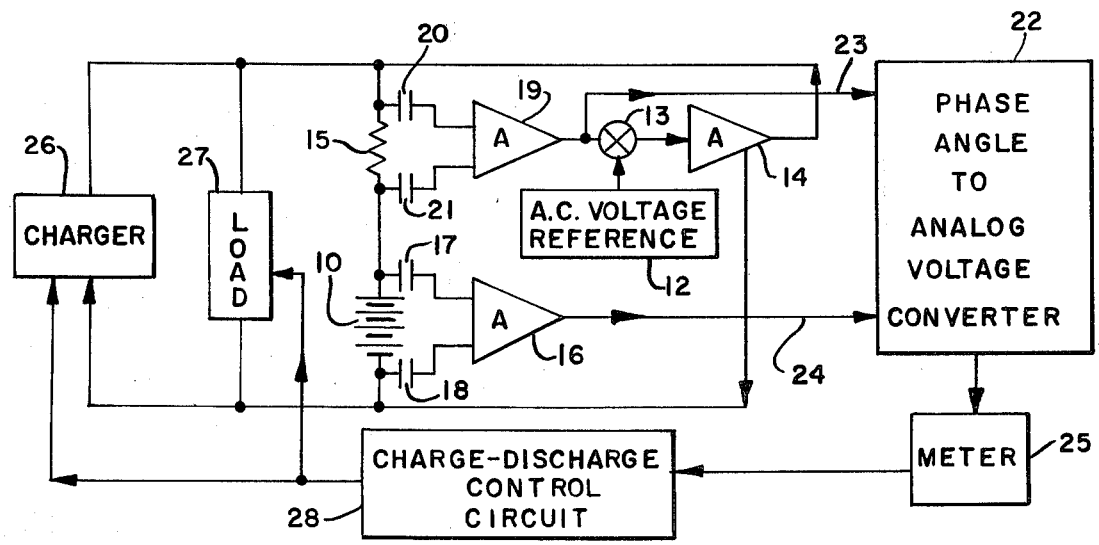
FIG. 3 shows in block diagram from a variation of FIG. 2 used to control the charging and discharging of a battery along with obtaining a measurement of the state of charge of the battery.

FIG. 2 provides only for a reading of the state of charge of battery 10. The analog voltage derived from phase angle to analog converter 22 could also be used for control purposes. FIG. 3 shows the FIG. 2 embodiment expanded to provide a control voltage as well as a state of charge reading. Thus, except for the addition of a component and the showing of load or charger 11 of FIG. 2 as two separate components in FIG. 3, the FIG. 2 and FIG. 3 circuits are identical and the like parts have like numerals.

In FIG. 3, load or charger 11 of FIG. 2 is shown as the separate charger 26 and the separate load 27. In addition, the charge — discharge control circuit 28 not provided in the circuit of FIG. 2 has its input coupled to meter 25 and has a first output coupled to charger 26 and a second output coupled to load 27. Charger 26 and 27 are connected in parallel across battery 10. In all other respects the circuit of FIG. 3 is identical to the circuit of FIG. 2 and operates in the same manner. However, in addition to providing a read-out of the state of charge of battery 10, the analog voltage derived from phase angle to analog voltage converter 22 is used to control charge — discharge control circuit 28 which in turn couples battery 10 to either load 27 or charger 26.

Since the analog voltage derived from phase angle to analog voltage converter 22 indicates the state of charge of battery 10, this voltage can be used to remove load 27 from battery 10 and place charger 26 on battery 10 when battery 10 is discharged below a given level, and can be used to disconnect charger 27 and reconnect load 27 when battery 10 is recharged to a given level. Charge — discharge control circuit 28 may be any well known switching circuitry that responds to the state of charge voltage. Charge — discharge control circuit 28 is shown as being connected to meter 25. The voltage applied to charge — discharge control circuit 28 can be the same analog voltage applied to meter 25 from phase angle to analog voltage converter 22 or meter 25 can be a meter that provides appropriate output signals at given readings.

The fact that the state of charge measurement derived from the circuit of FIG. 3 can be used for control purposes is apparent from the curve 30 of FIG. 5. Curve 30 of FIG. 5 is an ampere hours discharged versus phase angle curve. Curve 30 is a typical curve for a nickel cadmium battery discharged at a given current level. A family of such curves can be derived for a battery at different given discharge rates. All the curves of such a family of curves will be substantially identical to curve 30 but shifted up or down along the phase angle axis depending upon the current discharge level.

As shown in FIG. 4, curve 30 is fairly linear, with the phase angle decreasing at a substantially linear rate until approximately the 15 ampere hour discharge point is reached. At this point the phase angle decreases rapidly. By utilizing appropriate known circuitry, the analog voltage output of phase angle to analog voltage converter 22 will be substantially identical to curve 30. Thus, at the knee 31 of curve 30, for example, charge — discharge control circuit 28 could remove battery 10 from load 27 and place charger 26 across battery 10. When the analog voltage rises to the level approximately equivalent to the zero ampere hours discharged point on curve 30, charge — discharge control circuit 28 will disconnect battery 10 from charger 26 and place battery 10 back on load 27. Thus, if the circuit of FIG. 2 is utilized where a charging current is available, the circuitry of FIG. 3 can be used to keep battery 10 charged and will also provide a life cycle test since battery 10 is periodically charged and discharged while the state of charge is continuously monitored. Meter 25 could provide a print out so that a permanent record of the state of charge of battery 10 as it is charged and discharged would be provided.

FIG. 5 shows another embodiment of the invention. The FIG. 5 embodiment provides an automated charge — discharge circuit with continuous monitoring of the state of charge of the battery. In this case the state of charge voltage is not used to control the charging and discharging. As shown in FIG. 5, the circuit comprises a battery 30, a charge power supply 31, a first programable load bank 33, a D.C. charge current level circuit 32, a second programable load bank 34 and the D.C. discharge current circuit 35. The circuit of FIG. 5 also includes the A.C. current control reference voltage source 36, the shunt 45, the amplifier 37 having its input coupled across shunt 45 by means of the D.C. blocking capacitors 38 and 39, the amplifier 40 having its input coupled across battery 30 by means of the D.C. blocking capacitors 41 and 42, the phase angle circuit 43 having one of the inputs coupled to the output of amplifier 37 and its other input coupled to the output of amplifier 40 and its output coupled to the meter 44.

The circuit of FIG. 5 is an automatic charge — discharge life cycle test circuit that provides continuous state of charge monitoring. During the discharge cycle the level of discharge current drawn by the circuit is maintained at any desired level by means of D.C. discharge current level circuit 35. Programable load bank 34 is a constant current programable load bank adjusted or programmed by current level circuit 35. The A.C. current wave from A.C. current source 36 is applied to battery 30 through current level circuit 35 and programable load bank 34. The A.C. voltage appearing across the terminals of battery 30 is capacitively coupled to amplifier 40 by means of capacitors 41 and 42. The A.C. current flowing through battery 30 is measured by coupling the voltage across shunt 45 to the input of amplifier 37 through capacitors 38 and 39. The output of amplifier 37 is coupled to input 46 of phase angle circuit 43 which is preferably a phase angle to analog voltage converter and the output of amplifier 40 is coupled to the input 47 of phase angle circuit 43. Phase angle circuit 43 provides an output indicative of the state of charge of battery 30. This voltage is applied to meter 44 which may be a phase angle meter or may provide a state of charge reading. Further, meter 44 may provide a print out so that a permanent record can be obtained. During the discharge cycle programable load bank 33 is at its highest impedance and the charge current level is at zero.

When battery 30 has reached a given discharge level, for example, the level of knee 30 of curve 30 of FIG. 4, the circuit of FIG. 5 is switched from the discharge cycle to the charge cycle. Charging current is applied to battery 30 from charger power supply 31. The level of this charging current is set by D.C. charge current level circuit through programable load bank 33 which is also a constant current programable load bank and the discharge current level is of course zero.

During the charge cycle the A.C. current from A.C. current source 36 is applied to battery 30 in the same manner as it is during the discharge cycle. Thus, during the charge cycle a continuous state of charge reading is obtained from meter 44. When battery 30 is recharged as indicated by the state of charge reading on meter 44, the circuit is again switched to the discharge cycle and then discharged back to the charge cycle. During these charge-discharge cycles continuous state of charge monitoring is automatically obtained.

The switching back and forth to the charge and discharge cycles of the FIG. 5 can be accomplished automatically by, for example, including timing circuits that will automatically switch back and forth from the charging cycle to the discharging cycle after given periods of time. It is also pointed out that all the circuits shown by block diagram in FIG. 5 and in the rest of the Figures are well known circuits. While the state of charge voltage in the FIG. 5 circuit is not shown as being used to control the charge and discharge cycles, this could also be accomplished in a well known manner, similar to the method shown in FIG. 3.

FIG. 6 shows apparatus for measuring the state of charge of a battery in accordance with a second method of this invention. As shown in FIG. 6, the state of charge of a battery 50 is to be measured. The apparatus for accomplishing this measurement comprises a resistance 51 and an A.C. voltage source 52 connected in series across battery 50, a phase angle circuit 53 having a common input coupled to one end of battery 50 and one end of A.C. source 52, an "A" input coupled to the common point of A.C. source 52 and resistance 51 and a "B" input coupled to the common point of battery 50 and resistance 51 and a meter 55 coupled to the output of phase angle circuit 53.

With the apparatus of FIG. 6, the state of charge of battery 50 is measured by taking readings of the phase angle based on input to output A.C. voltages. This is accomplished by inserting resistance 51 between A.C. source 52 and battery 50 and connecting phase angle circuit 53 as shown in FIG. 6. As connected phase angle circuit 53 measures the phase angle difference between the A.C. voltage at one side of resistance 51 and the A.C. voltage at the other side of resistance 51. That is, phase angle circuit 53 measures the phase angle difference between the voltage across input A and the common input and the voltage across input B and the common input. Thus, the circuit of FIG. 6 measures the phase angle difference between the input and the output without the use of a shunt resistance and a constant current source. Phase angle circuit 53 may be a phase angle to analog voltage converter and meter 55 may provide a direct read out of the phase angle difference in response to the analog output from phase angle circuit 53.

While the invention has been described with reference to specific embodiments, it will be obvious to those skilled in the art that various changes and modifications can be made to the specific embodiments shown and described without departing from the spirit and scope of the invention as set forth in the claims.

What is claimed is:

1. A battery charge - discharge life cycle testing system including continuous battery state of charge monitoring comprising:
   a battery that is to be charge - discharge life cycle tested;
   a shunt coupled to said battery;
   a first programable load bank coupled across said shunt and said battery;
   a second programable load bank coupled in series with said shunt and said battery;
   a charging current power supply coupled to said battery through said second programable load bank and said shunt;

a D.C. charge level control circuit coupled to said second programable load bank;

a D.C. discharge current level control circuit coupled to said first programable load bank;

a reference voltage source having an alternating current output coupled to said D.C. discharge level control circuit, said alternating current output being applied to said battery through said D.C. discharge level control circuit, said first programable load bank and said shunt;

a first amplifier having its input coupled across said shunt and having an output;

a second amplifier having its input coupled across said battery and having an output;

a phase angle measuring circuit having a first input coupled to said output of said first amplifier, a second input coupled to said output of said second amplifier and having an output; and a meter coupled to said output of said phase angle measuring circuit.

2. A battery state of charge measuring system comprising:

a battery the state of charge of which is to be measured;

a shunt resistor coupled to said battery;

a load circuit and charging circuit coupled across said battery and said shunt resistor;

a first amplifier having its input capacitively coupled across said shunt resistor and having an output;

a second amplifier having its input capacitively coupled across said battery and having an output;

a source of alternating voltage;

a comparator having a first input coupled to said output of said first amplifier, a second input coupled to said reference source of alternating voltage and having an output;

an error amplifier having its input coupled to said output of said comparator and having its output coupled across said shunt resistor and said battery;

a phase angle to analog voltage converter having a first input coupled to said output of said first amplifier, a second input coupled to said output of said second amplifier and having an output; and a meter coupled to said output of said phase angle to analog voltage converter.

* * * * *